United States Patent [19]

Blokker, Jr. et al.

[11] Patent Number: 5,113,438
[45] Date of Patent: May 12, 1992

[54] METHOD AND APPARATUS FOR JAMMING INFRARED REMOTE CONTROLS

[75] Inventors: Johan F. Blokker, Jr., Overland Park; Eric B. Randall, Lenexa, both of Kans.

[73] Assignee: CableSoft, Inc., Lenexa, Kans.

[21] Appl. No.: 543,453

[22] Filed: Jun. 25, 1990

[51] Int. Cl.⁵ .............................................. H04K 1/00
[52] U.S. Cl. ...................................... 380/6; 359/142; 359/174
[58] Field of Search ...................... 455/603, 617, 601; 379/102; 358/194.1; 380/6

[56] References Cited

U.S. PATENT DOCUMENTS

| | | | |
|---|---|---|---|
| 3,543,351 | 10/1970 | Harnden, Jr. et al. | 455/603 |
| 4,196,347 | 4/1980 | Hadley | 455/603 |
| 4,267,606 | 5/1981 | Stelter et al. | 455/603 |
| 4,291,411 | 9/1981 | Müller et al. | 455/603 |
| 4,377,006 | 3/1983 | Collins et al. | 455/603 |
| 4,412,356 | 10/1983 | Klaus et al. | 455/603 |
| 4,449,244 | 5/1984 | Kopainsky | 455/603 |
| 4,504,974 | 3/1985 | Rademaker | 455/603 |
| 4,514,732 | 4/1985 | Hayes, Jr. | 455/603 |
| 4,531,238 | 7/1985 | Rawson et al. | 455/601 |
| 4,543,665 | 9/1985 | Sotelo et al. | 455/603 |
| 4,596,049 | 6/1986 | Rizzotti, III | 455/603 |
| 4,621,374 | 11/1986 | Mick et al. | 455/603 |
| 4,723,311 | 2/1988 | Moustakas et al. | 455/607 |
| 4,755,883 | 7/1988 | Uehira | 455/603 |
| 4,835,614 | 5/1989 | Ryu | 455/603 |
| 4,843,384 | 6/1989 | Ide et al. | 455/603 |

Primary Examiner—Thomas H. Tarcza
Assistant Examiner—David Cain
Attorney, Agent, or Firm—Wm. Bruce Day

[57] ABSTRACT

A jammer for an infrared remote control temporarily disables the remote control by transmitting an infrared pulse pattern similar to the pulse pattern of the remote control at approximately the same frequency but at a different pulse pattern, thereby confusing the detection circuitry of the receiving device, such as a television remote control receiver. The circuitry of the jammer preferably includes a timer for reducing battery power consumption by triggering a second timer on the transmitter to emit pulses only periodically.

2 Claims, 2 Drawing Sheets

METHOD AND APPARATUS FOR JAMMING INFRARED REMOTE CONTROLS

1. FIELD OF THE INVENTION

This invention relates to electrical and electromechanical systems that utilize a wireless infrared link such as for a remote control, data communication or the like. More particularly, this invention relates to an apparatus and method for jamming a wireless infrared radiation data communication link.

2. BACKGROUND OF THE INVENTION

Infrared remote controls are commonly used in many electronic devices such as televisions, video cassette recorders, and audio stereo components and compact disc players. At times, two persons may have different opinions about what television channel or entertainment unit is to be received. An example of this situation is when one person uses the remote control to change the TV channel continuously, making it uncomfortable to watch TV with them. These people are commonly called "channel checkers".

Infrared remote controls use pulses of infrared light to transmit information between electronic devices. Most such remote controls send the infrared pulse pattern, that represents the transmitted information twice. The receiving devices compares the two pulse patterns to confirm that the information was received correctly. If a difference is detected, an error in the transmission is assumed and the transmitted information is ignored.

Several standards for infrared remote controls are utilized. One standard uses infrared pulses in an asynchronous non-zero return format. This transmission method suffers from interference from other infrared sources in the room such as sunlight and incandescent light bulbs. Another standard uses a modulation scheme to improve noise immunity. The modulation scheme converts each bit of the pattern into a train of pulses of a given frequency. The receiver is designed to be sensitive only to infrared pulses at the same frequency as those of the transmitter. Therefore, other infrared light sources not at that frequency are rejected. Most common remote controls use the latter method because of the improved immunity from interference.

SUMMARY OF THE INVENTION

The primary object of the present invention is to provide a jammer for disabling the remote control, allowing other individuals to watch television or to default control the electronic device without annoying interruptions from "channel checkers" and others attempting to exercise control over the electronic device. The device works by causing errors in reception of the infrared pulses. Errors are created by providing device that transmits infrared pulses similar to the pulses sent by the remote control and when the jamming device transmits infrared pulse patterns at the same time as the remote control, the infrared receiver senses a confused pattern of infrared pulses. The confused pattern will be rejected or ignored by the infrared receiver.

The disclosed device uses two timer circuits to create a train of digital pulses similar to the pulses of a remote control. The first timer is designed to produce a pulsed wave at the same frequency used in a modulated infrared transmission method. The second timer reduces power consumption, which is particularly important for a hand-held, battery powered device. Since the information transmitted by the remote control is a long train of pulses, only periodic interference is needed to cause sufficient errors to disable the device. The second timer triggers the first timer only periodically and causes a burst of pulses of high-powered infrared light from the jammer to effectively reduce the power consumption to a fraction of that needed for continuous pulses. Additionally, another energy-saving technique used by the present invention is using multiple LEDs at a low current instead of using one LED at a high current.

BRIEF DESCRIPTION OF THE DRAWINGS

A detailed description of the invention will be made with reference to the accompanying drawings wherein like numerals designate corresponding parts in the several figures.

DETAILED DESCRIPTION OF THE PREFERRED EMBODIMENT

The following detailed description is of the best presently contemplated mode of carrying out the invention. This description is not to be taken in a limiting sense, but is made merely for the purposes of illustrating the general principles of the invention, since the scope of the invention is best defined by the appended claims.

Structural and operational characteristics attributed to forms of the invention first described, shall also be attributed to forms later described, unless such characteristics are obviously inapplicable or unless specific exception is made.

Figure 1:
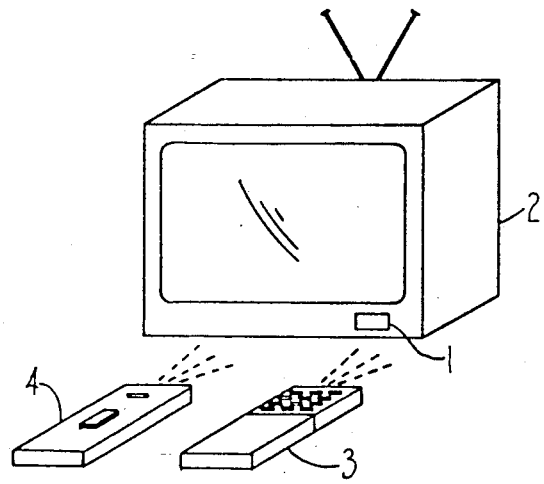
FIG. 1 is a perspective view illustrating the field of use of the disposed invention.

In FIG. 1 there is illustrated a light receiver for determining operation of a device, such as a television 2. Light receiver normally cooperates with a remote control infrared transmitter 3 in which controls operation of the television 2, cable converter, laser disc player, sound system or the like. A jammer 4 jams or periodically disables the transmitter 3 when desired.

The transmitter 3 preferably uses a modulation scheme to improve noise immunity from other infrared sources such as sunlight and incandescent light bulbs. The modulation scheme converts each bit of the pattern into a train of pulses of a given frequency. The receiver 1 is designed to be sensitive only to infrared pulses at near the same frequency as those of the transmitter 3. Therefore, other infrared light sources not near that frequency are rejected. Most modulation scheme transmitters emit two groups of infrared pulses for each data transmission. The first group of pulses is compared to the second group If the groups are identical, then the intelligence within the receiver 1 recognizes the transmission as valid and sends an appropriate signal to the control mechanism, such as the television 2. If the pulses are different then the transmission is ignored. Additionally, each receiver has an automatic gain control circuit (AGC) which adjusts the reception gain to the strongest infrared pulses in the room. If the jammer 4 is positioned further from the light receiver 1 than is the transmitter 3, the jammer 4 will have weaker pulses because the power of the infrared transmission is inversely proportional to the square of the distance the infrared waves must carry.

In operation, the jammer 4 emits a first pulse pattern. If the remote control transmitter is closer to the receiver 1 than the jammer 4 and the transmitter 3 emits a pulse pattern, then the AGC of receiver 1 will adjust to receive the pulse pattern of the transmitter 3 and will ignore pulses of the jammer 4. Next, the transmitter 3 will wait a predetermined period before sending its second pulse pattern. During this waiting period, the jammer 4 is sending its pulse pattern. The AGC of the receiver 1 mistakenly assumes that this is the second pulse pattern from the remote control transmitter 3 and compares this pulse pattern to the original pulse pattern sent by the transmitter 3. The intelligence of receiver 1 will determine that the pulse patterns ar different and will ignore the command from the transmitter 3. The jamming device has therefore effectively defeated the remote control transmitter 3's transmission of instruction.

Figure 2:
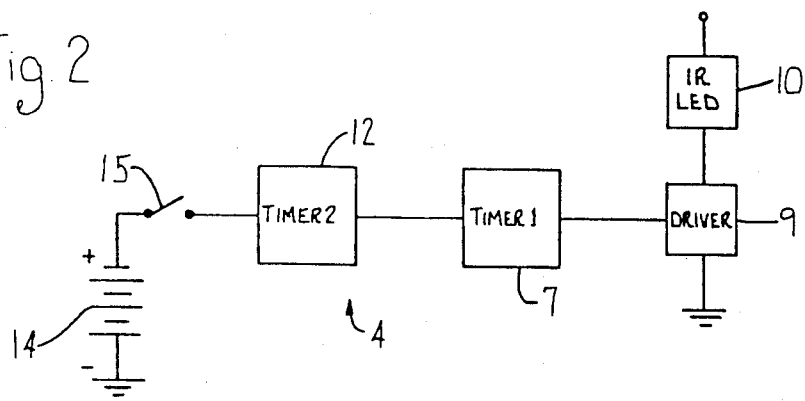
FIG. 2 is diagrammatic view illustrating the fundamental components of the system incorporating the present invention.

In the illustrated example, FIG. 2, the jammer 4 uses two timer circuits to create a train of digital pulses similar to the pulses of a remote control transmitter 3. A first timer 7 produces a pulsed wave at the same frequency used in the modulated infrared transmitter 3. Preferably, the timer 1 produces a pulse train that is low for 20 microseconds and is high for 5 microseconds. Timer 1 produces a square wave signal that is applied to a transistor driver circuit 9 that pulses one or more infrared LEDs 10.

Figure 3:
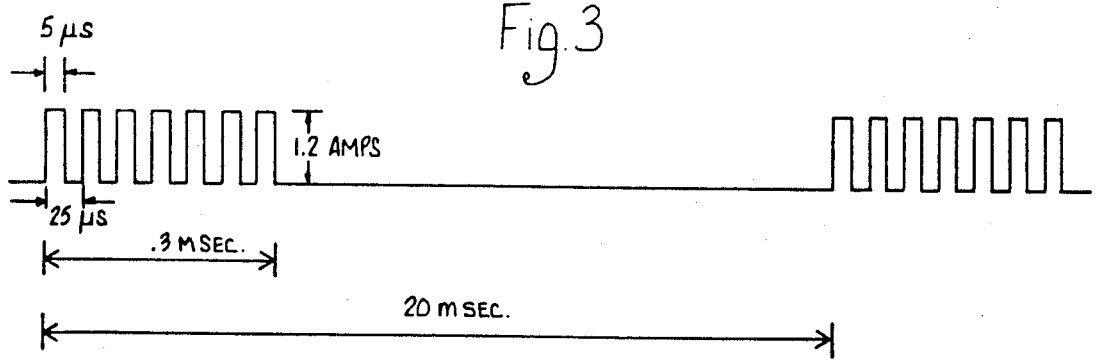
FIG. 3 is a plan view illustrating waveforms of electrical impulses employed in the present invention.

FIG. 3 is a waveform of the signal sent by the driver 9 to the LED 10. The output power of the LED 10 is proportional to the current applied to the LED. Preferably the current needed is from 0.1 amp to 2 amps at a voltage of about 3 volts. The jammer 4 transmits a power greater than that transmitted by most remote control transmitters 3. This can be achieved by increasing the number of LEDs 10 and by increasing the current through the LEDs.

In the illustrated example, the jammer 4, FIG. 2, is a handheld battery driven device where power and voltage requirements are of great concern. A second timer 12 is used to reduce the power consumption. Since the information transmitted by the remote control transmitter 3 is a long train of pulses only periodic interference is sufficient to cause errors to disable the device 2. The second timer 12 triggers the first timer 7 once every 20 microseconds. This causes a burst of pulses of high powered infrared light every 50th of a second and effectively reduces the current consumption to 1/50th of that which is needed of that which would otherwise be needed for continuous pulses. It will be appreciated that the circuit shown in FIG. 2 includes a battery, represented at 14 and a on/off switch 15.

The characteristics of the signal from the driver 9 to the LED 10 are shown in the waveform identified as FIG. 3 wherein the pulses are at 1.2 amps, each pulse width is at 5 uSec for the positive pulse portion and entire positive and negative going pulse pair is 25 uSec in length. Each train of pulses is 0.3 milliseconds in length and the combined burst and constant voltage is 20 milliseconds in length.

As shown in FIG. 2, multiple LEDs are shown diagrammatically as block 10 and preferably, the jammer 4 uses multiple LEDs at a low current instead of using one LED at a high current to produce the needed infrared power output. Using a 9-volt battery 14, two LEDs can be driven in series and the continuous current requirements reduced to under 20 milliamps.

Additionally, beneficial results have been obtained with a LED having a spectral emission sensitivity of 880 nanometers, which matches the spectral sensitivity of the receiving detector 1. A Siemans SFH-RR 485-1 infrared LED is used and has a power output of 16 to 32 mW/sr at 100 mA. At higher currents, the LED will emit more infrared power, such as at 1 amp the same device will emit 160 to 320 mW/sr. The disclosed LED preferably provides a medium width beam of 40 degrees for the angle of transmission of light.

Also preferably, the frequency of pulses emitted from the jammer 4 are from 30 khz to 60 khz and having a repetition of the pulse burst less than 30 microseconds.

Figure 4:
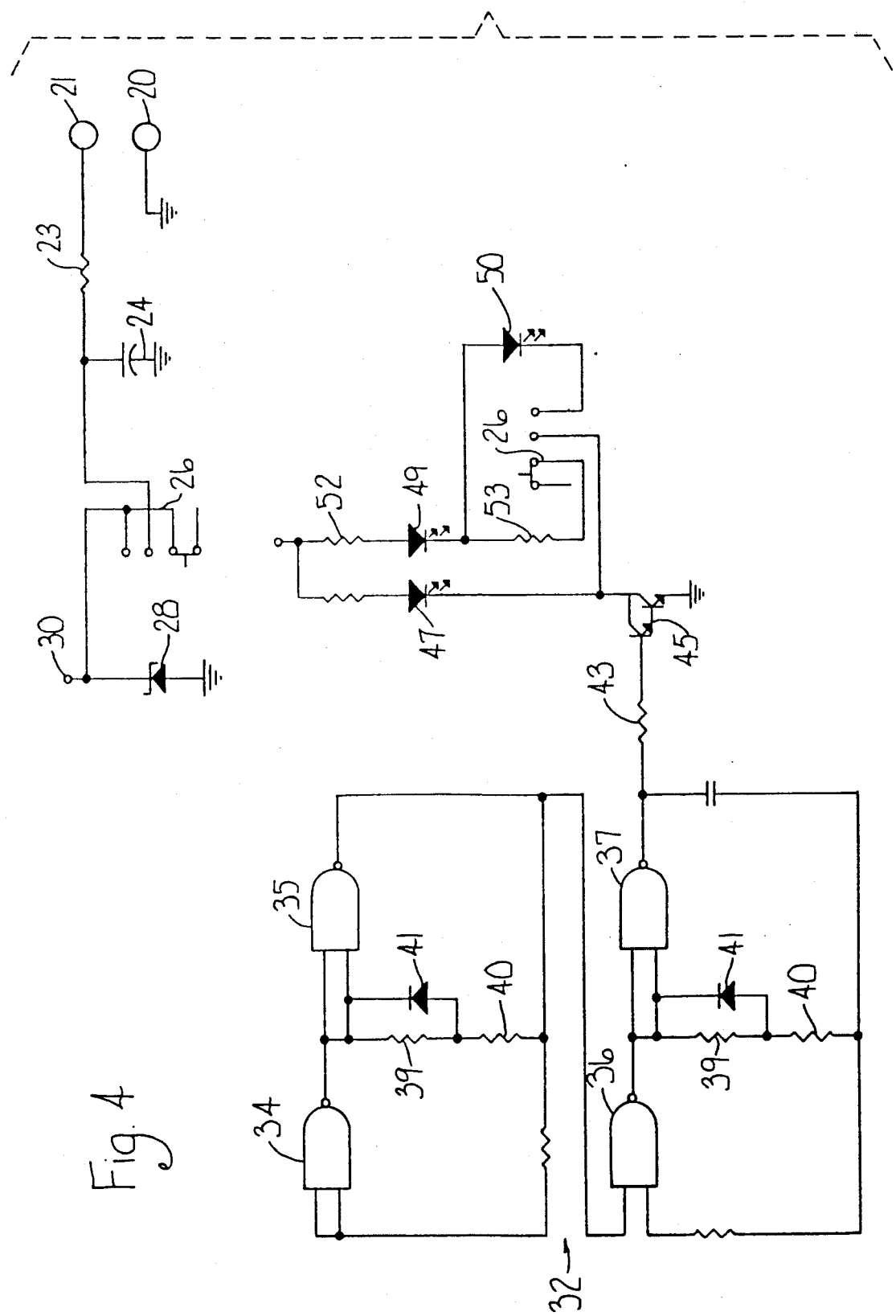
FIG. 4 is a schematic diagram of the jammer circuit.

A preferred embodiment of a jammer 4 is shown in connection with FIG. 4 wherein respective negative and positive battery leads 20 and 21 for a 9-volt battery provide DC current through a 47 ohm resistor 23 and charging a capacitor 24, the capacitor 24 acting as a temporary storage device. Current is routed through a three position switch 26 providing an off position, a low power position, and a high power position. Current then flows through a protective Zener diode 28 and to VCC 30. From VCC 30 the current is passed to an integrated chip package 32. The IC package 32 contains four integrated chips 34, 35, 36, and 37 with ICs 34 and 35 paired and ICs 36 and 37 paired. Each pair of ICs includes a resistor 39 and a resistor 40 and a diode 41. The IC package 32 provides an NAND gate circuit in which ICs 34 and 35 form a timer/oscillator circuit. ICs 36 and 37 form a second oscillator. ICs 34 and 35 form the timer 12 in FIG. 2 and ICs 36 and 37 form the timer 7. In summary, current input to the IC package 32 is routed through integrated chips 34 and 35 and 36 and 37 forming NAND gates configured to form two oscillators. Chip pair 34 and 35 form a low frequency oscillator inputting current into chip 36 to gate it on and off. Chips 36 and 37 form a high frequency oscillator pair so that every time the low frequency oscillator pair 34 and 35 is on, it turns on the high frequency oscillator pair 36 and 37 to output a multiple burst of rapid pulses until the low frequency oscillator pair 34 and 35 shuts off the current again. The result is the pulse pattern shown in FIG. 3. Current outputted by the oscillator pair 36 and 37 is routed through resistor 43 acting as a buffer and the impulses are then routed through a pair of transistors 45 acting as a Darlington pair of transistors to increase gain. Impulses are then directed through an LED 47 which preferably is simply a red LED indicating power on. The 3 position switch 26 (shown in two places in FIG. 4) controls operation of IR LEDs 49 and 50 through resistor pairs 52 and 53 controlling current to the LED. Infrared light signals from the LEDs are of course directed to the light receiver 1 to cause jamming of the device controlled by the receiver.

Alternatively, a laser may be utilized instead of pulsing infrared LEDs in order to transmit more powerful light over a larger distance. The receiver will view the laser light as being more powerful and will adjust the AGC to the laser signal, effectively jamming a remote control signal. Substitution of laser transmitters for the LEDs is simply done and induces exchange of the resistors 52 and 53 for those of appropriate resistance value.

It is to be understood that while certain forms of this invention have been illustrated and described, the invention is not limited thereto except insofar as such limitations are included in the following claims.

Intending to claim novel, useful and unobvious features shown or described, the following claims are made.

1. A device for jamming an infrared receiver comprising:
   (a) a television viewing system having an infrared receiver and circuitry for passing intelligence signals from said receiver and causing channel changes of said television viewing system;
   (b) a first portable light transmitter emitting signal pulses and determining operation of said television viewing system;
   (c) a second portable light transmitter having circuitry emitting, substantially simultaneously with said first light transmitter, a second light pulse pattern having pulses in the range of 30-60 kHz, pulse bursts having a repetition rate of less than 30 ms, and a pulse burst length of at least 0.2 ms;
   (d) said pulses from said first portable light transmitter and said second portable light transmitter reaching said receiver and causing disfunction of said circuitry causing channel changes.

2. An apparatus for jamming an infrared receiver comprising:
   (a) emitter means including two LED's for transmitting a pulsed wave of IR energy at a frequency receivable by an IR sensitive receiver; and
   (b) two cooperating timer means for enabling said emitter means to periodically produce bursts of pulses at intervals, said pulses being received by an infrared receiver and causing said receiver to malfunction.

* * * * *